US008692920B2

(12) United States Patent
Hiyama et al.

(10) Patent No.: US 8,692,920 B2
(45) Date of Patent: Apr. 8, 2014

(54) SOLID-STATE IMAGING APPARATUS, A/D CONVERTER, AND CONTROL METHOD THEREOF

(75) Inventors: Hiroki Hiyama, Sagamihara (JP); Kohichi Nakamura, Kawasaki (JP); Kazuhiro Saito, Tokyo (JP); Tetsuya Itano, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 20 days.

(21) Appl. No.: 13/570,580

(22) Filed: Aug. 9, 2012

(65) Prior Publication Data

US 2013/0070136 A1    Mar. 21, 2013

(30) Foreign Application Priority Data

Sep. 15, 2011   (JP) ................... 2011-202336

(51) Int. Cl.
- *H04N 3/14*      (2006.01)
- *H04N 5/335*     (2011.01)
- *H03M 1/12*      (2006.01)

(52) U.S. Cl.
USPC ........................... 348/308; 348/302; 341/155

(58) Field of Classification Search
USPC .......... 348/294–324; 341/155, 118, 158–159, 341/166
See application file for complete search history.

(56) References Cited

U.S. PATENT DOCUMENTS

| | | | |
|---|---|---|---|
| 4,815,027 A | 3/1989 | Tokumitsu et al. | |
| 5,761,345 A | 6/1998 | Saito et al. | |
| 6,104,832 A | 8/2000 | Saito et al. | |
| 6,385,338 B1 | 5/2002 | Saito et al. | |
| 6,605,850 B1 | 8/2003 | Kochi et al. | |
| 6,670,990 B1 | 12/2003 | Kochi et al. | |
| 6,946,637 B2 | 9/2005 | Kochi et al. | |
| 6,960,751 B2 | 11/2005 | Hiyama et al. | |
| 7,110,030 B1 | 9/2006 | Kochi et al. | |
| 7,193,747 B2 | 3/2007 | Saito | |
| 7,385,172 B2 | 6/2008 | Inoue et al. | |
| 7,429,764 B2 | 9/2008 | Koizumi et al. | |
| 7,460,162 B2 | 12/2008 | Koizumi et al. | |
| 7,518,539 B2 | 4/2009 | Han et al. | |
| 7,528,878 B2 | 5/2009 | Sato et al. | |
| 7,538,804 B2 | 5/2009 | Okita et al. | |
| 7,547,871 B2 | 6/2009 | Hiyama et al. | |

(Continued)

FOREIGN PATENT DOCUMENTS

| | | |
|---|---|---|
| EP | 2104235 A1 | 9/2009 |
| EP | 2182722 A2 | 5/2010 |
| JP | 2008-067358 A | 3/2008 |
| JP | 2010-109893 A | 5/2010 |

*Primary Examiner* — Kelly L Jerabek

(74) *Attorney, Agent, or Firm* — Fitzpatrick, Cella, Harper & Scinto

(57) ABSTRACT

In an A/D converter, a first analog signal which is input to an input terminal in a state in which the input terminal and a reference voltage line are connected via a first capacitor is converted into digital data when a reference signal is supplied to the reference signal line in a state in which the reference signal line and a first input terminal of a comparator are connected via the first capacitor. A second analog signal which is input to the input terminal in a state in which the input terminal and the reference voltage line are connected via a second capacitor is converted into digital data when the reference signal is supplied to the reference signal line in a state in which the reference signal line and the first input terminal of the comparator are connected via the second capacitor.

14 Claims, 9 Drawing Sheets

(56) References Cited

U.S. PATENT DOCUMENTS

| | | |
|---|---|---|
| 7,741,593 B2 | 6/2010 | Iwata et al. |
| 7,755,688 B2 | 7/2010 | Hitano et al. |
| 7,812,876 B2 | 10/2010 | Hiyama et al. |
| 7,825,974 B2 | 11/2010 | Itano et al. |
| 7,869,096 B2 | 1/2011 | Saito |
| 7,920,192 B2 | 4/2011 | Watanabe et al. |
| 7,961,237 B2 | 6/2011 | Hatano et al. |
| 7,978,241 B2 | 7/2011 | Koizumi et al. |
| 8,023,025 B2 | 9/2011 | Itano et al. |
| 8,063,351 B2 | 11/2011 | Kobayashi et al. |
| 8,063,958 B2 | 11/2011 | Okita et al. |
| 8,063,967 B2 | 11/2011 | Itano et al. |
| 8,081,245 B2 | 12/2011 | Itano et al. |
| 8,085,319 B2 | 12/2011 | Ono et al. |
| 8,159,577 B2 | 4/2012 | Iwata et al. |
| 8,174,604 B2 | 5/2012 | Shibata et al. |
| 8,208,055 B2 | 6/2012 | Hiyama |
| 8,218,050 B2 | 7/2012 | Ogura et al. |
| 8,289,431 B2 | 10/2012 | Itano |
| 8,421,889 B2 * | 4/2013 | Hiyama et al. ............... 348/272 |
| 2007/0216564 A1 * | 9/2007 | Koseki ............... 341/155 |
| 2008/0055143 A1 | 3/2008 | Han et al. |
| 2008/0136948 A1 * | 6/2008 | Muramatsu ............... 348/294 |
| 2008/0239106 A1 * | 10/2008 | Sano ............... 348/241 |
| 2009/0009635 A1 * | 1/2009 | Maeda et al. ............... 348/241 |
| 2009/0167585 A1 | 7/2009 | Yeom |
| 2009/0190018 A1 | 7/2009 | Sakakibara |
| 2009/0201406 A1 | 8/2009 | Okita et al. |
| 2009/0310001 A1 | 12/2009 | Masuyama et al. |
| 2009/0322922 A1 | 12/2009 | Saito et al. |
| 2010/0060762 A1 | 3/2010 | Takada et al. |
| 2010/0060763 A1 | 3/2010 | Hiyama et al. |
| 2010/0149394 A1 | 6/2010 | Yamazaki et al. |
| 2010/0165164 A1 * | 7/2010 | Muramatsu ............... 348/302 |
| 2010/0225796 A1 * | 9/2010 | Lim et al. ............... 348/308 |
| 2010/0314530 A1 | 12/2010 | Hiyama et al. |
| 2010/0328510 A1 | 12/2010 | Hiyama et al. |
| 2011/0013050 A1 * | 1/2011 | Aruga et al. ............... 348/241 |
| 2011/0019025 A1 * | 1/2011 | Koseki ............... 348/222.1 |
| 2011/0141324 A1 * | 6/2011 | Koseki ............... 348/241 |
| 2011/0157441 A1 | 6/2011 | Okita et al. |
| 2011/0157447 A1 | 6/2011 | Watanabe et al. |
| 2011/0279723 A1 * | 11/2011 | Takamiya et al. ............... 348/308 |
| 2012/0026371 A1 | 2/2012 | Itano et al. |
| 2012/0081586 A1 | 4/2012 | Itano et al. |
| 2012/0086841 A1 | 4/2012 | Ono et al. |
| 2012/0113284 A1 | 5/2012 | Okita et al. |
| 2012/0168610 A1 | 7/2012 | Iwata et al. |
| 2012/0217379 A1 | 8/2012 | Hiyama |
| 2012/0217603 A1 | 8/2012 | Koizumi et al. |
| 2013/0026343 A1 | 1/2013 | Saito et al. |
| 2013/0057742 A1 | 3/2013 | Nakamura et al. |
| 2013/0062503 A1 | 3/2013 | Saito et al. |
| 2013/0088292 A1 | 4/2013 | Maehashi et al. |
| 2013/0089320 A1 | 4/2013 | Hiyama et al. |

* cited by examiner

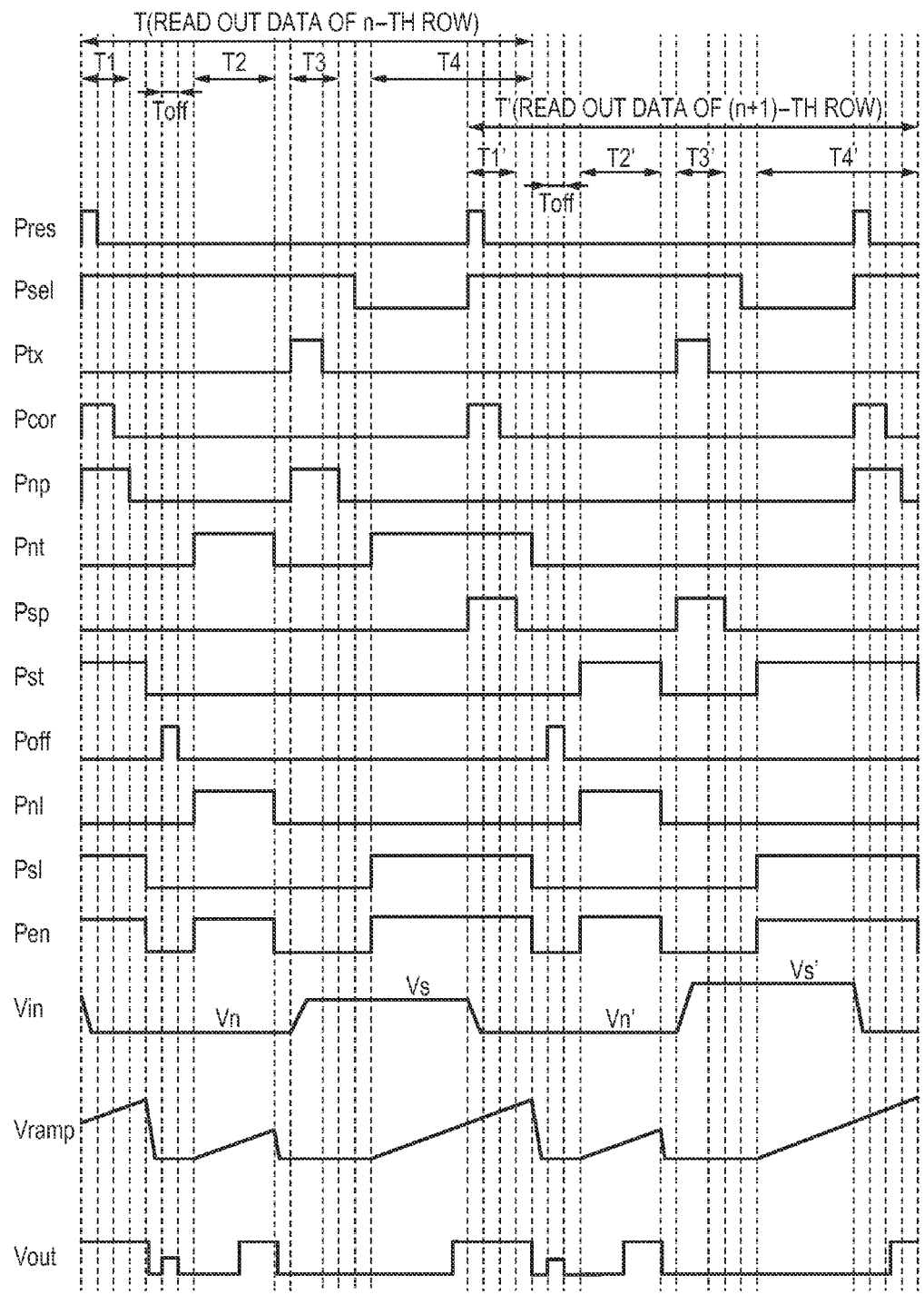

SOLID-STATE IMAGING APPARATUS, A/D CONVERTER, AND CONTROL METHOD THEREOF

BACKGROUND OF THE INVENTION

1. Field of the Invention

The present invention relates to a solid-state imaging apparatus, an A/D converter, and a control method thereof.

2. Description of the Related Art

In order to speed up the operation of a CMOS image sensor which incorporates A/D converters, a technique for parallel executing of read-out processing of analog signals from pixels, and A/D conversion of the readout analog signals has been proposed. For example, Japanese Patent Laid-Open No. 2008-067358 describes that two capacitors are provided to a ramp A/D converter, a pixel signal of a given row is held in one capacitor, the held pixel signal is A/D-converted, and a pixel signal of the next row is written in the other capacitor. In each capacitor, one electrode is fixed to a reference voltage, and the other electrode is connected to a pixel. Then, the electrode connected to the pixel is re-connected to a comparator, thus A/D-converting the pixel signal held in the capacitor.

SUMMARY OF THE INVENTION

With the technique disclosed in Japanese Patent Laid-Open No. 2008-067358, noise is mixed in digital data after the A/D conversion due to crosstalk between the capacitors, resulting in an image quality degradation. For example, since a pixel signal of the (n+1)-th row is written in the other capacitor while that of the n-th row is A/D-converted, the pixel signal of the (n+1)-th row is mixed as noise in that of the n-th row which is being A/D-converted due to the crosstalk between the capacitors. Causes of such crosstalk include crosstalk via a parasitic capacitance between the electrodes to which a pixel signal is supplied, and that via a common impedance between the electrodes connected to a reference power supply. Hence, an aspect of the present invention provides a technique for reducing crosstalk between two capacitors in an A/D converter including the capacitors which respectively hold analog signals.

A first aspect of the present invention provides an A/D converter for respectively converting a first analog signal and a second analog signal into digital data, comprising: an input terminal for inputting the first analog signal and the second analog signal in turn; a first capacitor and a second capacitor; a reference voltage line for connecting to a reference voltage source; a reference signal line for connecting to a signal source that generates a reference signal which changes temporally; a comparator which has a first input terminal and a second input terminal, and outputs an output signal according to a comparison result between an input voltage supplied to the first input terminal and a threshold voltage supplied to the second input terminal; and an output circuit which outputs digital data corresponding to a time from when the input voltage supplied to the first input terminal of the comparator begins to change until the output signal of the comparator changes, wherein the first analog signal which is input to the input terminal in a state in which the input terminal and the reference voltage line are connected via the first capacitor is converted into digital data when the reference signal is supplied to the reference signal line in a state in which the reference signal line and the first input terminal of the comparator are connected via the first capacitor, and the second analog signal which is input to the input terminal in a state in which the input terminal and the reference voltage line are connected via the second capacitor is converted into digital data when the reference signal is supplied to the reference signal line in a state in which the reference signal line and the first input terminal of the comparator are connected via the second capacitor.

A second aspect of the present invention provides an A/D converter comprising: an input terminal; a first capacitor and a second capacitor; a reference voltage line; a ramp signal line; a differential input comparator having a non-inverting input terminal and an inverting input terminal; a latch circuit to which a count value is supplied, and which outputs the count value supplied when an output signal of the comparator changes; a switch group which switches a state in which the first capacitor is connected between the input terminal and the reference voltage line and a state in which the first capacitor is connected between the ramp signal line and the non-inverting input terminal of the comparator; and a switch group which switches a state in which the second capacitor is connected between the input terminal and the reference voltage line and a state in which the second capacitor is connected between the ramp signal line and the non-inverting input terminal of the comparator.

A third aspect of the present invention provides a method of controlling an A/D converter, the converter comprising an input terminal for inputting a first analog signal and a second analog signal in turn, a first capacitor and a second capacitor, a reference voltage line for connecting to a reference voltage source, a reference signal line for connecting to a signal source for generating a reference signal which changes temporally, a comparator which has a first input terminal and a second input terminal, and outputs an output signal according to a comparison result between an input voltage supplied to the first input terminal and a threshold voltage supplied to the second input terminal, an output circuit which outputs digital data corresponding to a time from when the input voltage supplied to the first input terminal of the comparator begins to change until the output signal of the comparator changes, and a switch group which switches connection destinations of the first capacitor and the second capacitor. The method comprises: inputting the first analog signal to the input terminal in a state in which the input terminal and the reference voltage line are connected via the first capacitor, and then supplying the reference signal to the reference signal line in a state in which the reference signal line and the first input terminal of the comparator are connected via the first capacitor; and inputting the second analog signal to the input terminal in a state in which the input terminal and the reference voltage line are connected via the second capacitor, and then supplying the reference signal to the reference signal line in a state in which the reference signal line and the first input terminal of the comparator are connected via the second capacitor.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 9 is a timing chart for illustrating yet another example of the operation of the solid-state imaging apparatus 100 according to the embodiment of the present invention.

DESCRIPTION OF THE EMBODIMENTS

Figure 1:
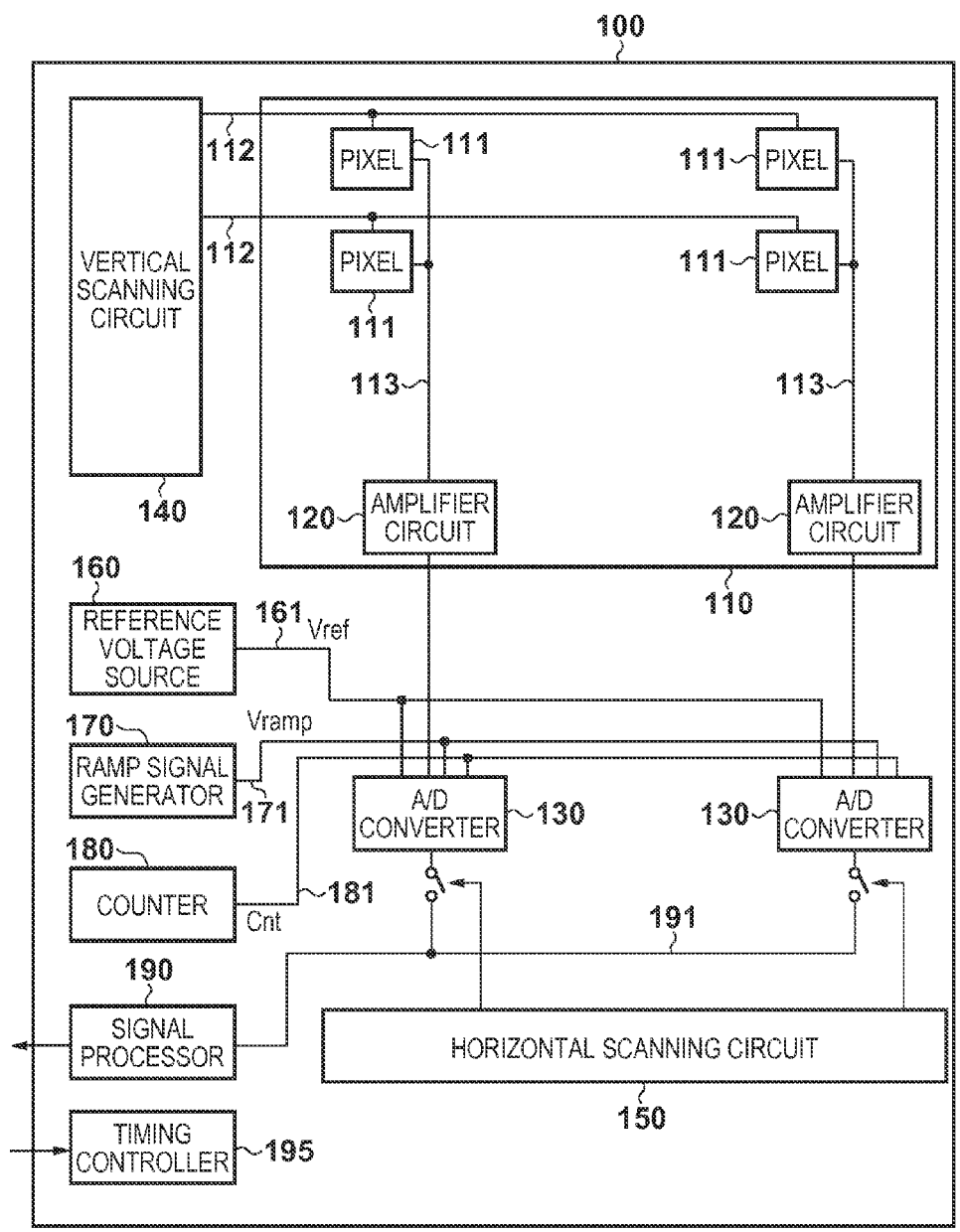
FIG. 1 is a block diagram for illustrating an example of the arrangement of a solid-state imaging apparatus 100 according to an embodiment of the present invention.

An embodiment of the present invention will be described hereinafter with reference to the accompanying drawings. The same reference numerals denote the same components throughout the drawings, and a repetitive description thereof will be avoided.

An example of a schematic arrangement of a solid-state imaging apparatus 100 according to one embodiment of the present invention will be described below with reference to FIG. 1. The solid-state imaging apparatus 100 is, for example, a CMOS image sensor, which photoelectrically converts incoming light indicating an object image, and externally outputs an electrical signal obtained by the photoelectric conversion as digital data. The solid-state imaging apparatus 100 can include an analog signal generator 110 including a pixel array formed by arranging a plurality of pixels 111 in a matrix. FIG. 1 illustrates four pixels 111 for the sake of simplicity, but the number of pixels 111 is not limited to this. Each pixel 111 photoelectrically converts incoming light to the solid-state imaging apparatus 100 into an analog signal.

The solid-state imaging apparatus 100 can further include a vertical scanning circuit 140. The vertical scanning circuit 140 supplies a driving pulse signal in turn to row selection lines 112 arranged in correspondence with respective pixel rows. When the driving pulse signal is supplied to each row selection line 112, analog signals are read out from respective pixels 111 included in the corresponding pixel row onto column signal lines 113. This embodiment will handle a case in which a reset-level signal of the pixel 111 and a signal obtained by superimposing a signal according to a charge generated by the photoelectric conversion on the reset-level signal are read out from the pixel 111. A difference between these signals represents an effective pixel value. The analog signal generator 110 outputs, based on these signals, a noise signal at a reset timing and a pixel signal depending on a charge obtained by the photoelectric conversion for each pixel 111.

The analog signal generator 110 can further include amplifier circuits 120 for respective column signal lines 113. Each amplifier circuit 120 amplifies the analog signal input from the corresponding pixel 111 via the column signal line 113, and supplies the amplified analog signal to a corresponding A/D converter 130. The solid-state imaging apparatus 100 can further include A/D converters 130 in correspondence with respective column signal lines 113. Each A/D converter converts the input analog signal into digital data, and outputs the digital data.

The solid-state imaging apparatus 100 can further include a reference voltage source 160, ramp signal generator 170, and counter 180. The reference voltage source 160 supplies a reference voltage Vref to the respective A/D converters 130 via a reference voltage line 161. The ramp signal generator 170 generates a ramp signal Vramp which changes in a slope pattern along with an elapse of time, and supplies the generated ramp signal Vramp to the respective A/D converters 130 via a ramp signal line 171. The counter 180 supplies a count value Cnt to the respective A/D converters 130 via a count data line 181. As the counter 180, for example, a gray counter or binary counter may be used, and the counter 180 may have an up-down function. This embodiment will handle an example in which the plurality of A/D converters 130 share the reference voltage source 160, the ramp signal generator 170, and the counter 180. Alternatively, each A/D converter 130 may have these components.

The solid-state imaging apparatus 100 can further include a horizontal scanning circuit 150 and signal processor 190. The horizontal scanning circuit 150 transfers digital data output from the A/D converters 130 onto a digital signal line 191 for respective columns. Digital data transferred onto the digital signal line 191 is supplied to the signal processor 190. In this embodiment, digital data corresponding to a noise signal and that corresponding to a pixel signal are read out in turn on the digital signal line 191. The signal processor 190 subtracts the digital data corresponding to the noise signal from that corresponding to the pixel signal, and externally outputs an effective pixel value.

The solid-state imaging apparatus 100 can further include a timing controller 195 which supplies pulse signals to the aforementioned components to control the operation of the solid-state imaging apparatus 100. FIG. 1 does not illustrate any signal lines used to transmit the pulse signals from the timing controller 195 to the respective components. The pulse signals supplied from the timing controller 195 will be described in detail later using timing charts to be described later.

In this embodiment, since the solid-state imaging apparatus 100 includes the amplifier circuits 120, the influences of noise components generated by the A/D converters 130 can be reduced. However, a modification of the solid-state imaging apparatus 100 may not include any amplifier circuit 120, and analog signals from the pixels 111 may be directly supplied to the A/D converters 130 via the column signal lines 113. Another modification of the solid-state imaging apparatus 100 may include CDS circuits in place of the amplifier circuits 120, and each CDS circuit may supply an analog signal obtained by subtracting a reset-level signal from a signal according to a charge generated by the pixel to the A/D converter 130. Each A/D converter converts this analog signal into digital data, and the horizontal scanning circuit 150 transfers the digital data corresponding to a pixel value of each pixel 111 to the signal processor 190. In the example shown in FIG. 1, the amplifier circuits 120, the A/D converters 130, and the horizontal scanning circuit 150 are arranged on one side of the pixel array. Alternatively, these components may be arranged on both the sides of the pixel array, and data may be distributed to the components on either one side for respective pixel columns.

Figure 2:
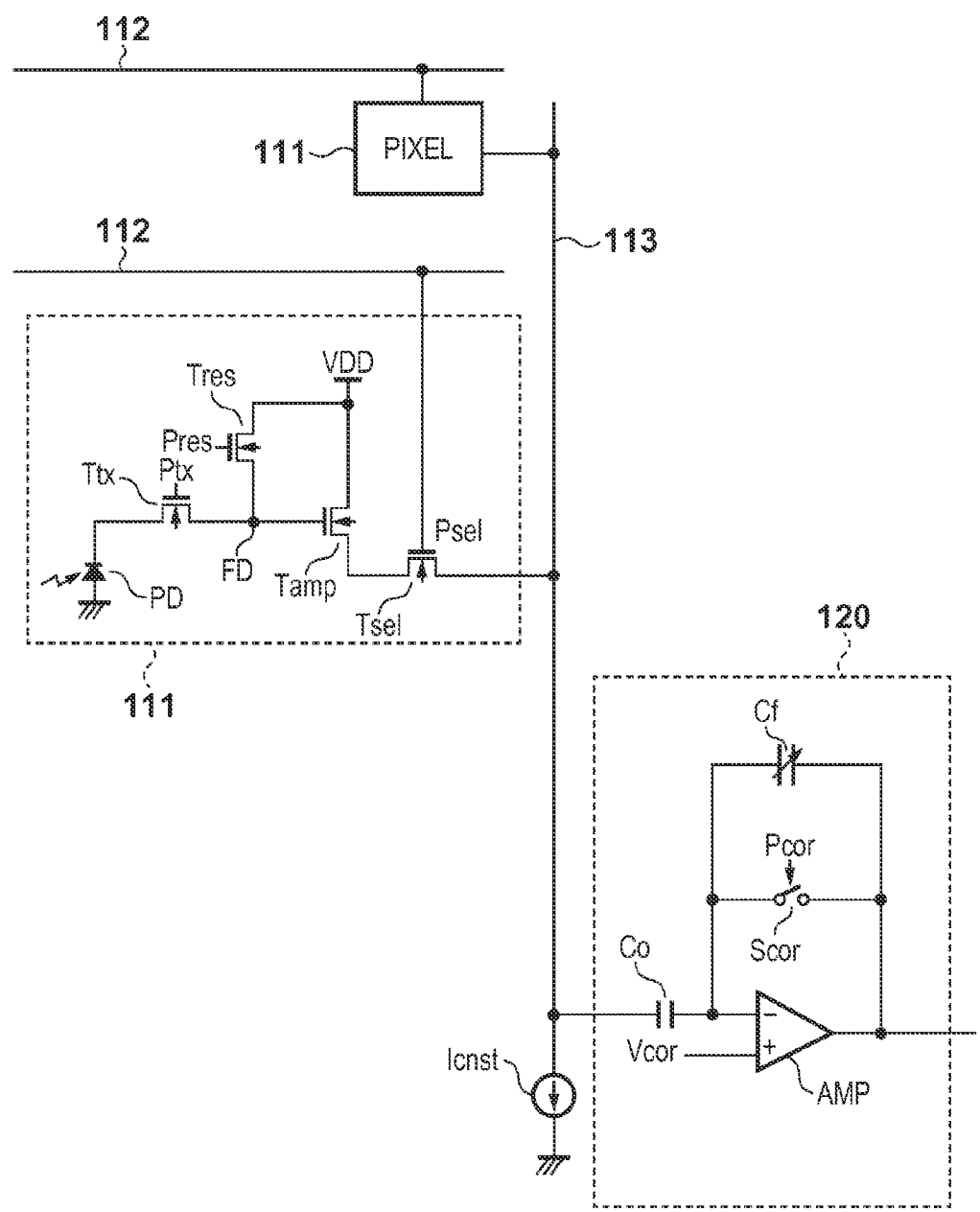
FIG. 2 is a circuit diagram for illustrating an example of the arrangements of a pixel 111 and amplifier circuit 120 according to the embodiment of the present invention.

An example of schematic arrangements of the pixel 111 and amplifier circuit 120 included in the solid-state imaging apparatus 100 will be described below with reference to the equivalent circuit diagram of FIG. 2. The pixel 111 and amplifier circuit 120 may have arbitrary arrangements as long as an analog signal required for calculating a pixel value of that pixel 111 can be supplied to the A/D converter 130. The pixel 111 includes a photodiode PD required to execute the photoelectric conversion and a plurality of transistors. The photodiode PD is connected to a floating diffusion FD via a transfer transistor Ttx. The floating diffusion FD is also connected to a voltage source VDD via a reset transistor Tres, and to a gate electrode of an amplifier transistor Tamp. A first main electrode of the amplifier transistor Tamp is connected to the voltage source VDD, and a second main electrode of the amplifier transistor Tamp is connected to the column signal line 113 via a selection transistor Tsel. A gate electrode of the selection transistor Tsel is connected to the row selection line 112. When the selection transistor Tsel is turned on, the amplifier transistor Tamp operates as a source-follower circuit together with a constant current source Icnst inserted in the column signal line 113.

The amplifier circuit 120 includes the illustrated circuit elements, and configures an inverting amplifier. A non-inverting input terminal of an amplifier AMP is connected to the column signal line 113 via a clamp capacitor Co, and Vcor is supplied to an inverting input terminal of the amplifier AMP. An output terminal of the amplifier AMP is connected to the A/D converter 130. A parallel circuit of a feedback capacitor Cf and switch Scor is connected between the non-inverting input terminal and output terminal of the amplifier AMP. By configuring a clamp circuit in this manner, the amplifier circuit 120 not only amplifies and outputs a signal input via the column signal line 113 by a ratio between the clamp capacitor Co and feedback capacitor Cf, but also operates a CDS circuit. As a result, as a noise signal at a pixel reset timing, an offset of the amplifier circuit 120 is output from the analog signal generator 110. Also, as a pixel signal depending on a charge obtained by the photoelectric conversion, a signal from which a reset-level signal is removed is output from the analog signal generator 110. In an embodiment in which the amplifier circuit 120 is omitted, the analog signal generator 110 outputs a reset-level signal of the pixel as a noise signal, and a signal obtained by superimposing a signal according to a charge generated by the pixel on the reset-level signal as a pixel signal. In this embodiment, noise components generated as a result of resetting of the floating diffusion FD can be reduced.

Figure 3:
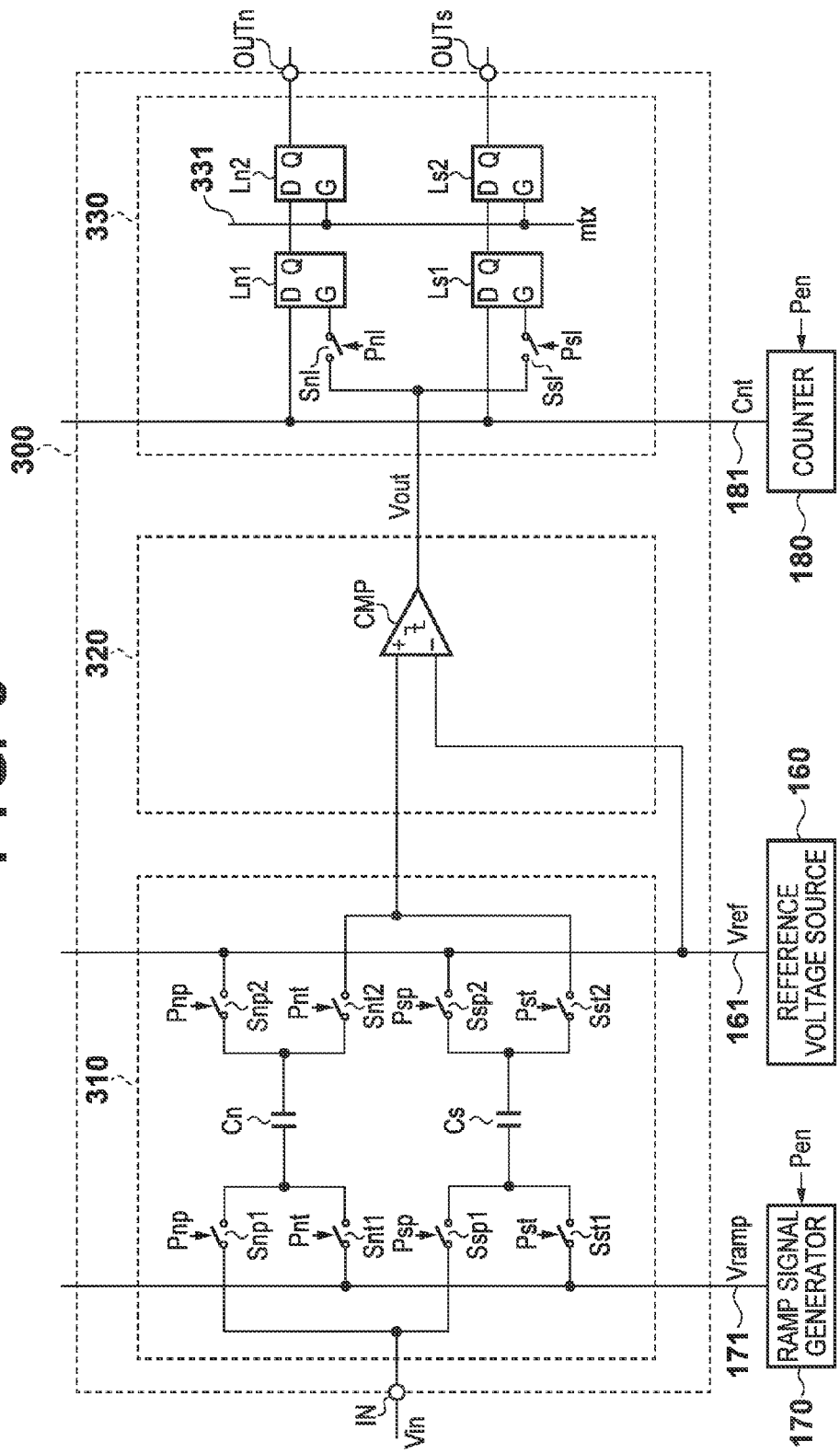
FIG. 3 is a circuit diagram for illustrating an example of the arrangement of an A/D converter 300 according to the embodiment of the present invention.

A schematic arrangement of an A/D converter 300 as an example of the A/D converter 130 shown in FIG. 1 will be described below with reference to the equivalent circuit diagram shown in FIG. 3. The A/D converter 300 can include an input terminal IN, output terminals OUTn and OUTs, holding circuit 310, comparison circuit 320, and output circuit 330. The holding circuit 310 holds an analog signal Vin input from the input terminal IN. To the input terminal IN, a plurality of analog signals (for example, a first analog signal and a second analog signal) are input in turn. The comparison circuit 320 compares an input voltage, which is supplied to itself based on the analog signal held in the holding circuit 310, with a threshold voltage to be compared, and outputs an output signal Vout of a level according to that comparison result. The output circuit 330 outputs digital data based on the output signal Vout from the comparison circuit 320 and the count value Cnt supplied from the counter 180 from the output terminal OUTn or OUTs.

The holding circuit 310 can include a capacitor Cn (first capacitor) and capacitor Cs (second capacitor), which respectively hold analog signals, and one or more switches (switch group) used to switch connection destinations of these capacitors Cn and Cs. A first electrode (left electrode in FIG. 3) of the capacitor Cn is connected to the input terminal IN via a switch Snp1, and to the ramp signal line 171 via a switch Snt1. A second electrode (right electrode in FIG. 3) of the capacitor Cn is connected to the reference voltage line 161 via a switch Snp2 and to the comparison circuit 320 via a switch Snt2. Likewise, a first electrode (left electrode in FIG. 3) of the capacitor Cs is connected to the input terminal IN via a switch Ssp1, and to the ramp signal line 171 via a switch Sst1. A second electrode (right electrode in FIG. 3) of the capacitor Cs is connected to the reference voltage line 161 via a switch Ssp2 and to the comparison circuit 320 via a switch Sst2.

The comparison circuit 320 can include a differential input comparator CMP having a non-inverting input terminal (first input terminal) and inverting input terminal (second input terminal). The non-inverting input terminal ("+" terminal in FIG. 3) of the comparator CMP is connected to an output line of the holding circuit 310, and the inverting input terminal ("−" terminal in FIG. 3) of the comparator CMP is connected to the reference voltage line 161. An output terminal of the comparator CMP is connected to the output circuit 330.

The output circuit 330 can include four latch circuits Ln1, Ln2, Ls1, and Ls2, which store digital data. Both of a D terminal of the latch circuit Ln1 and that of the latch circuit Ls1 are connected to the count data line 181. A G terminal of the latch circuit Ln1 is connected to the output line of the comparison circuit 320 via a switch Snl, and a G terminal of the latch circuit Ls1 is connected to the output line of the comparison circuit 320 via a switch Ssl. A Q terminal of the latch circuit Ln1 is connected to a D terminal of the latch circuit Ln2, and a Q terminal of the latch circuit Ls1 is connected to a D terminal of the latch circuit Ls2. Both of a G terminal of the latch circuit Ln2 and that of the latch circuit Ls2 are connected to a signal line 331. A Q terminal of the latch circuit Ln2 is connected to the output terminal OUTn, and a Q terminal of the latch circuit Ls2 is connected to the output terminal OUTs.

Figure 4:
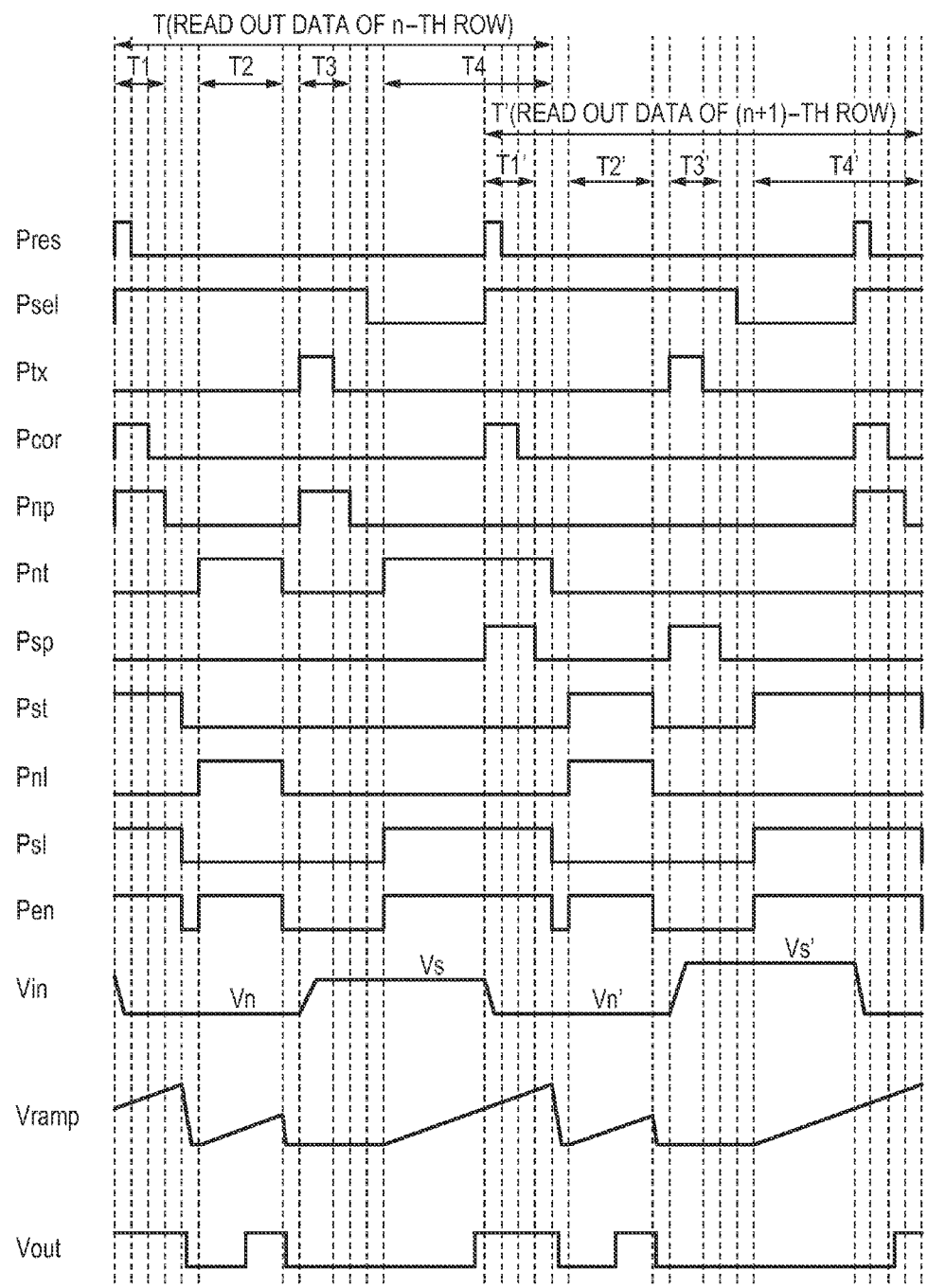
FIG. 4 is a timing chart for illustrating an example of the operation of the solid-state imaging apparatus 100 according to the embodiment of the present invention.

An example of the operation of the solid-state imaging apparatus 100 having the A/D converters 300 will be described below with reference to the timing chart shown in FIG. 4. Respective pulse signals shown in FIG. 4 are generated by the timing controller 195, and are supplied to respective circuit elements in the solid-state imaging apparatus 100. In FIG. 4, an identical pulse signal is supplied to some switch groups, but pulse signals may be individually supplied to respective switches. The same applies to other timing charts. FIG. 4 will explain the operations of the pixel 111 (first pixel) of the n-th row and the pixel 111 (second pixel) of the (n+1)-th row, from which data are continuously read out. Digital data of the pixel 111 of the n-th row is read out to the signal processor 190 during a period T, and digital data of the pixel 111 of the (n+1)-th row is read out to the signal processor 190 during a period T'. As shown in FIG. 4, since the periods T and T' partially overlap each other, a time required for the A/D conversion can be shortened.

The read-out operation of the pixel 111 of the n-th row will be described first. During a period T1, a noise signal Vn as an analog signal is held in the capacitor Cn. At the beginning of the period T1, pulse signals Pres, Psel, and Pcor respectively go H (High level), thus turning on the reset transistor Tres, selection transistor Tsel, and switch Scor. Thus, the floating diffusion FD is reset. In this state, the amplifier transistor Tamp operates as a source-follower, and a reset-level signal of the floating diffusion FD is read out onto the column signal line 113. When the pulse signal Pcor goes L (Low level), the clamp capacitor Co holds a potential difference between Vcor and the pixel output. The output of the amplifier circuit 120 at this time is supplied to the input terminal IN of the A/D converter 300 as the noise signal Vn. The noise signal Vn contains an offset of the amplifier circuit 120. The noise signal Vn is continuously supplied until a pulse signal Ptx goes H.

At the beginning of the period T1, a pulse signal Pnp goes H, thus turning on the switches Snp1 and Snp2. As a result, the input terminal IN and reference voltage line 161 are connected via the capacitor Cn, and the capacitor Cn holds a difference between the reference voltage Vref and noise signal Vn. More specifically, a potential of the first electrode of the capacitor Cn becomes equal to the noise signal Vn, and that of the second electrode of the capacitor Cn becomes equal to the reference voltage Vref. After the end of the period T1, the pulse signal Pnp goes L (Low level), thus turning off the switches Snp1 and Snp2.

Next, during a period T2, the noise signal Vn is A/D-converted. At the beginning of the period T2, a pulse signal Pen goes H. Then, the ramp signal generator 170 begins to change the ramp signal Vramp to be supplied onto the ramp signal line 171, and the counter 180 begins to count and supplies the count value Cnt onto the count data line 181. In this embodiment, when the pulse signal Pen goes H, the ramp signal generator 170 supplies the ramp signal Vramp, which begins from Vref and linearly increases along with an elapse of time, onto the ramp signal line 171. At the beginning of the period T2, a pulse signal Pnt goes H, thus turning on the switches Snt1 and Snt2. As a result, the ramp signal line 171 and the non-inverting input terminal of the comparator CMP are connected via the capacitor Cn. Furthermore, since a pulse signal Pnl goes H, the switch Snl is also turned on. As a result, the output terminal of the comparator CMP is connected to the G terminal of the latch circuit Ln1.

When the ramp signal Vramp begins to increase, a potential of the first electrode of the capacitor Cn also increases, and a potential of the second electrode of the capacitor Cn and a voltage of the non-inverting input terminal of the comparator CMP also increase accordingly. More specifically, at a supply start timing of the ramp signal Vramp, the potential of the first electrode of the capacitor Cn becomes equal to Vref, and the potential of the second electrode of the capacitor Cn becomes equal to (2*Vref−Vn). Thus, the voltage of the non-inverting input terminal of the comparator CMP becomes equal to (2*Vref−Vn). Then, when the voltage of the non-inverting input terminal of the comparator CMP exceeds the voltage Vref of the inverting input terminal, the output signal Vout from the comparator CMP is inverted from L to H. As a result, an H-level signal is supplied to the G terminal of the latch circuit Ln1, and the count value Cnt supplied to the D terminal at that time is stored in the latch circuit Ln1 and is output from the Q terminal. The output signal Vout of the comparator CMP is inverted when the voltage of the non-inverting input terminal of the comparator CMP becomes equal to Vref. For this reason, the latch circuit Ln1 stores a count value corresponding to a time required for the voltage of the non-inverting input terminal of the comparator CMP to change from (2*Vref−Vn) to Vref, that is, a count value corresponding to (Vn−Vref). Therefore, the count value stored in the latch circuit Ln1 is digital data corresponding to the noise signal Vn as the analog signal.

Next, during a period T3, a pixel signal Vs as an analog signal is held by the capacitor Cn. At the beginning of the period T3, the pulse signal Ptx goes H, and the transfer transistor Ttx is turned on. Thus, a charge accumulated on the photodiode PD is transferred to the floating diffusion FD. In this state, the amplifier transistor Tamp operates as a source-follower, and a signal obtained by superimposing a signal according to the charge accumulated on the photodiode PD on the reset-level signal of the floating diffusion FD is read out onto the column signal line 113. The readout signal is amplified by the amplifier circuit 120, and is supplied to the input terminal IN of the A/D converter 300 as the pixel signal Vs. Since the clamp capacitor Co holds the potential difference between the pixel output during the period T1 and Vcor, the signal output from the amplifier circuit 120 ideally does not contain any noise component generated upon resetting of the floating diffusion FD.

Since the operation of the A/D converter 300 during the period T3 is the same as that of the A/D converter 300 during the period T1, a repetitive description thereof will be avoided. After the end of the period T3, the potential of the first electrode of the capacitor Cn becomes equal to the pixel signal Vs, and the potential of the second electrode of the capacitor Cn becomes equal to the reference voltage Vref.

Next, during a period T4, the pixel signal Vs is A/D-converted. Since the period T4 is the same as the period T2, differences will be mainly described below. During period T4, a pulse signal Psl goes H, thereby turning on the switch Ssl. As a result, the output terminal of the comparator CMP is connected to the G terminal of the latch circuit Ls1. When the ramp signal Vramp increases and the voltage of the non-inverting input terminal of the comparator CMP exceeds the voltage Vref of the inverting input terminal, the output signal Vout from the comparator CMP is inverted from L to H. As a result, the count value Cnt supplied to the D terminal at that time is stored in the latch circuit Ls1 and is output from the Q terminal. The latch circuit Ls1 stores a count value corresponding to a time required for the voltage of the non-inverting input terminal of the comparator CMP to change from (2*Vref−Vs) to Vref, that is, a count value corresponding to (Vs−Vref). Therefore, the count value stored in the latch circuit Ls1 is digital data corresponding to the pixel signal Vs as the analog signal. After the period T4, a pulse signal mtx (not shown in FIG. 4) is supplied to the G terminals of the latch circuits Ln2 and Ls2. Thus, the latch circuit Ln2 stores the output from the latch circuit Ln1 and outputs it from the output terminal OUTn. Also, the latch circuit Ls2 stores the output from the latch circuit Ls1 and outputs it from the output terminal OUTs. Then, the horizontal scanning circuit 150 sequentially reads out the digital data output from the output terminals OUTn and OUTs onto the digital signal line 191.

The read-out operation of digital data about the pixel 111 of the (n+1)-th row will be described below. Unlike in the pixel 111 of the n-th row, analog signals (noise signal Vn', pixel signal Vs') input to the A/D converter 300 are held in the capacitor Cs. That is, during a period T1', the noise signal Vn' is held in the capacitor Cs. Next, during a period T2', the noise signal Vn' is A/D-converted. Next, during a period T3', the pixel signal Vs' is held in the capacitor Cs. Finally, during a period T4', the pixel signal Vs' is A/D-converted. Since the timings of the pulse signals supplied to the respective circuit elements in the read-out operation of the pixel 111 of the (n+1)-th row are the same as those in the read-out operation of the pixel 111 of the n-th row, a repetitive description thereof will be avoided.

As shown in the timing chart of FIG. 4, the A/D conversion period T4 of the pixel signal Vs of the pixel 111 of the n-th row overlaps the holding period T1' of the noise signal Vn' of the pixel 111 of the (n+1)-th row. Thus, the overall A/D conversion period required for the pixels 111 of the solid-state imaging apparatus 100 can be shortened. By controlling the A/D converter 300 so as not to simultaneously connect the capacitors Cn and Cs to a common circuit arrangement, crosstalk via a common impedance can be reduced. Since the reference voltage Vref is supplied to the capacitor Cs while the ramp signal Vramp is supplied to the capacitor Cn, crosstalk due to capacitive coupling can also be reduced. Therefore, the solid-state imaging apparatus 100 having the A/D converters 300 can attain imaging operations at a high frame rate in which interlinear crosstalk can be reduced.

The embodiment described using the timing chart of FIG. 4 uses Vref as an initial value of the ramp signal Vramp, but another voltage may be used. Also, the reference voltage Vref is supplied to the inverting input terminal of the comparator CMP, but another voltage may be supplied. For example, when a voltage Va is used as the initial value of the ramp signal Vramp, a voltage Vb is supplied to the inverting input terminal of the comparator CMP, and the input signal Vin is input to the input terminal IN, digital data which expresses (Vin+Vb−Va−Vref) is output from the output circuit 330. Since the signal processor 190 calculates a difference between the digital data which expresses (Vn+Vb−Va−Vref) and that which expresses (Vs+Vb−Va−Vref), digital data which expresses (Vn−Vs) is obtained. A signal source which generates another reference signal which changes temporally in place of the ramp signal may be used as the ramp signal generator 170. In this case, this reference signal is supplied to each A/D converter 130 via a reference signal supply line. The reference signal can use an arbitrary signal as long as it monotonically changes along with an elapse of time. An example of the reference signal includes a signal which changes step by step along with an elapse of time in addition to the aforementioned ramp signal. In this case, "monotonic change" means a change in potential without increasing in case of, for example, a monotonic decrease.

Figure 5:
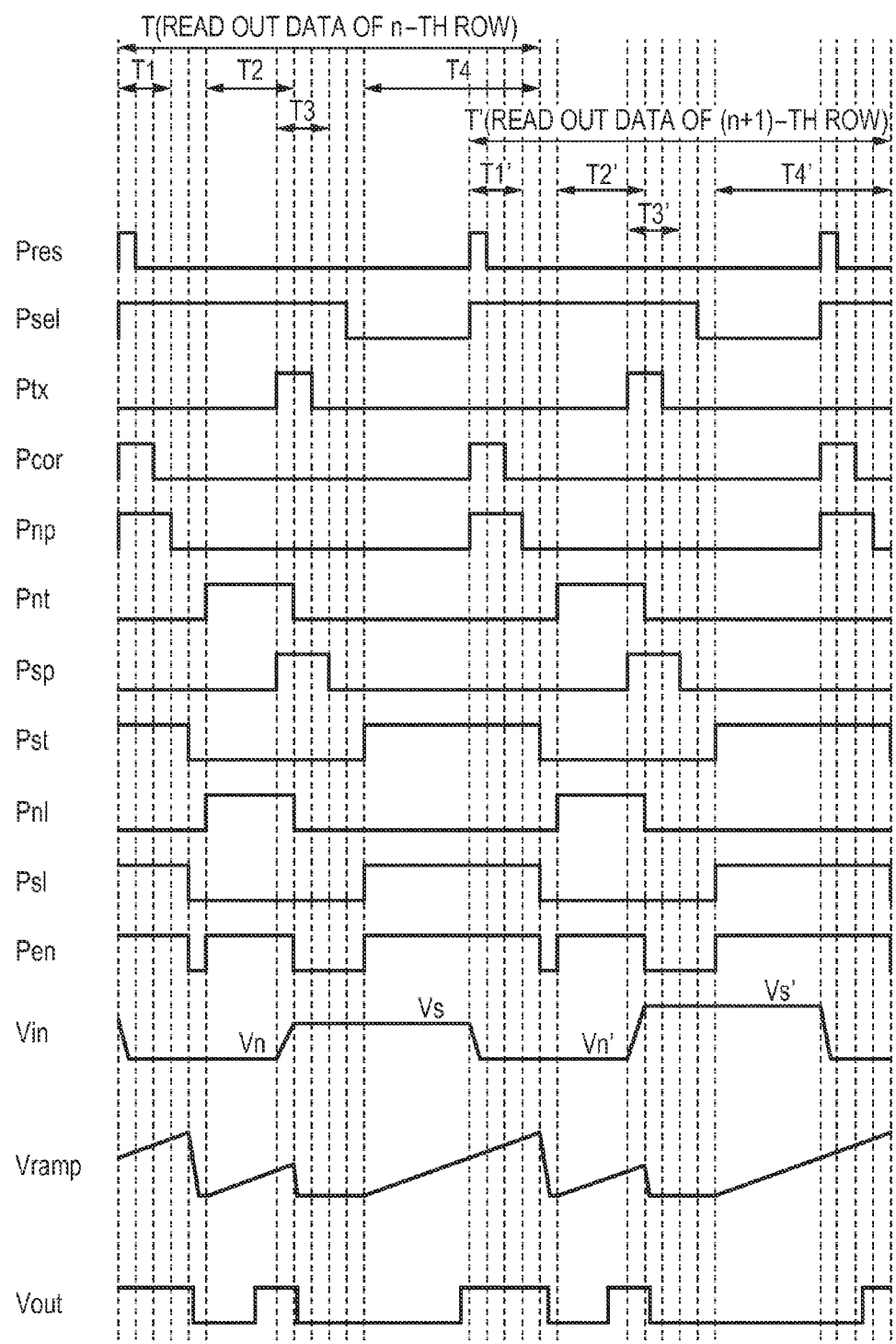
FIG. 5 is a timing chart for illustrating another example of the operation of the solid-state imaging apparatus 100 according to the embodiment of the present invention.

Another example of the operation of the solid-state imaging apparatus 100 having the A/D converters 300 will be described below with reference to the timing chart shown in FIG. 5. A repetitive description of parts common to the timing chart shown in FIG. 4 will be avoided. In the timing chart shown in FIG. 5, waveforms of the pulse signals Pnp, Pnt, Psp, and Pst are different from the timing chart shown in FIG. 4. Since the pulse signal Psp goes H during the period T3, the pixel signal Vs of the pixel 111 of the n-th row is held in the capacitor Cs in place of the capacitor Cn. Thus, the A/D conversion period T2 of the noise signal Vn of the pixel 111 of the n-th row can overlap the holding period T3 of the pixel signal Vs of the pixel 111 of the n-th row. For this reason, the overall A/D conversion period required for the pixels 111 of the solid-state imaging apparatus 100 can be further shortened.

Figure 6:
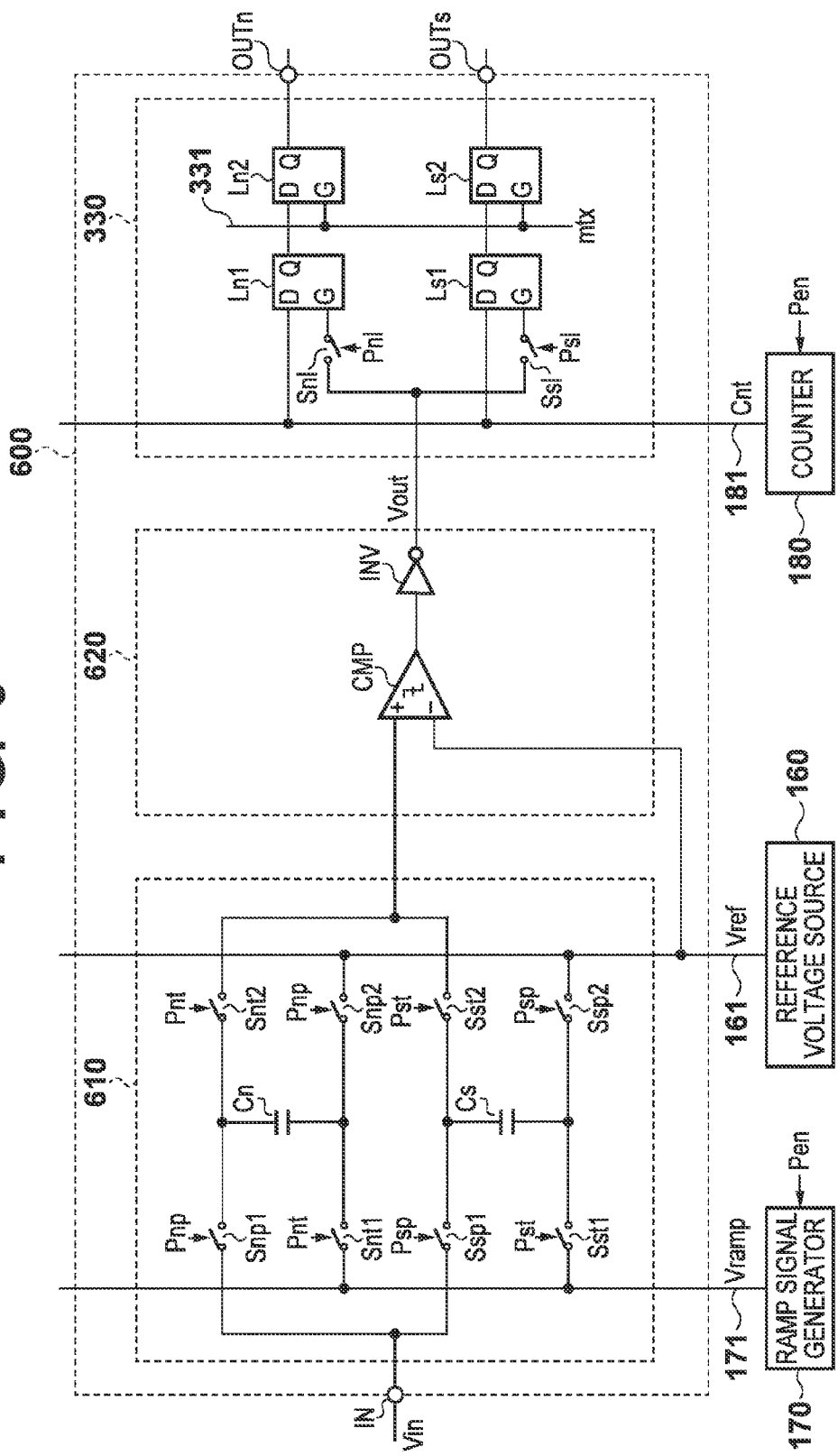
FIG. 6 is a circuit diagram for illustrating an example of the arrangement of an A/D converter 600 according to the embodiment of the present invention.

A schematic arrangement of an A/D converter 600 as another example of the A/D converter 130 shown in FIG. 1 will be described below with reference to the equivalent circuit diagram of FIG. 6. The same reference numerals in FIG. 6 denote elements common to the A/D converter 300 shown in FIG. 3, and a repetitive description thereof will be avoided. The A/D converter 600 can include an input terminal IN, output terminals OUTn and OUTs, holding circuit 610, comparison circuit 620, and output circuit 330. The holding circuit 610 holds an analog signal Vin input from the input terminal IN. The comparison circuit 620 compares an input voltage, which is supplied to itself based on the analog signal held in the holding circuit 610, with a threshold voltage to be compared, and outputs an output signal Vout of a level according to that comparison result. The holding circuit 610 can include two capacitors Cn and Cs, which respectively hold analog signals, and one or more switches used to switch connection destinations of these capacitors Cn and Cs. A first electrode (upper electrode in FIG. 6) of the capacitor Cn is connected to the input terminal IN via a switch Snp1, and to the comparison circuit 620 via a switch Snt2. A second electrode (lower electrode in FIG. 6) of the capacitor Cn is connected to the reference voltage line 161 via a switch Snp2 and to the ramp signal line 171 via a switch Snt1. Likewise, a first electrode (upper electrode in FIG. 6) of the capacitor Cs is connected to the input terminal IN via a switch Ssp1, and to the comparison circuit 620 via a switch Sst2. A second electrode (lower electrode in FIG. 6) of the capacitor Cs is connected to the reference voltage line 161 via a switch Ssp2 and to the ramp signal line 171 via a switch Sst1.

The comparison circuit 620 can include a differential input comparator CMP and inverter INV. A non-inverting input terminal of the comparator CMP is connected to an output line of the holding circuit 610, and an inverting input terminal of the comparator CMP is connected to the reference voltage line 161. An output terminal of the comparator CMP is connected to the output circuit 330 via the inverter INV.

Figure 7:
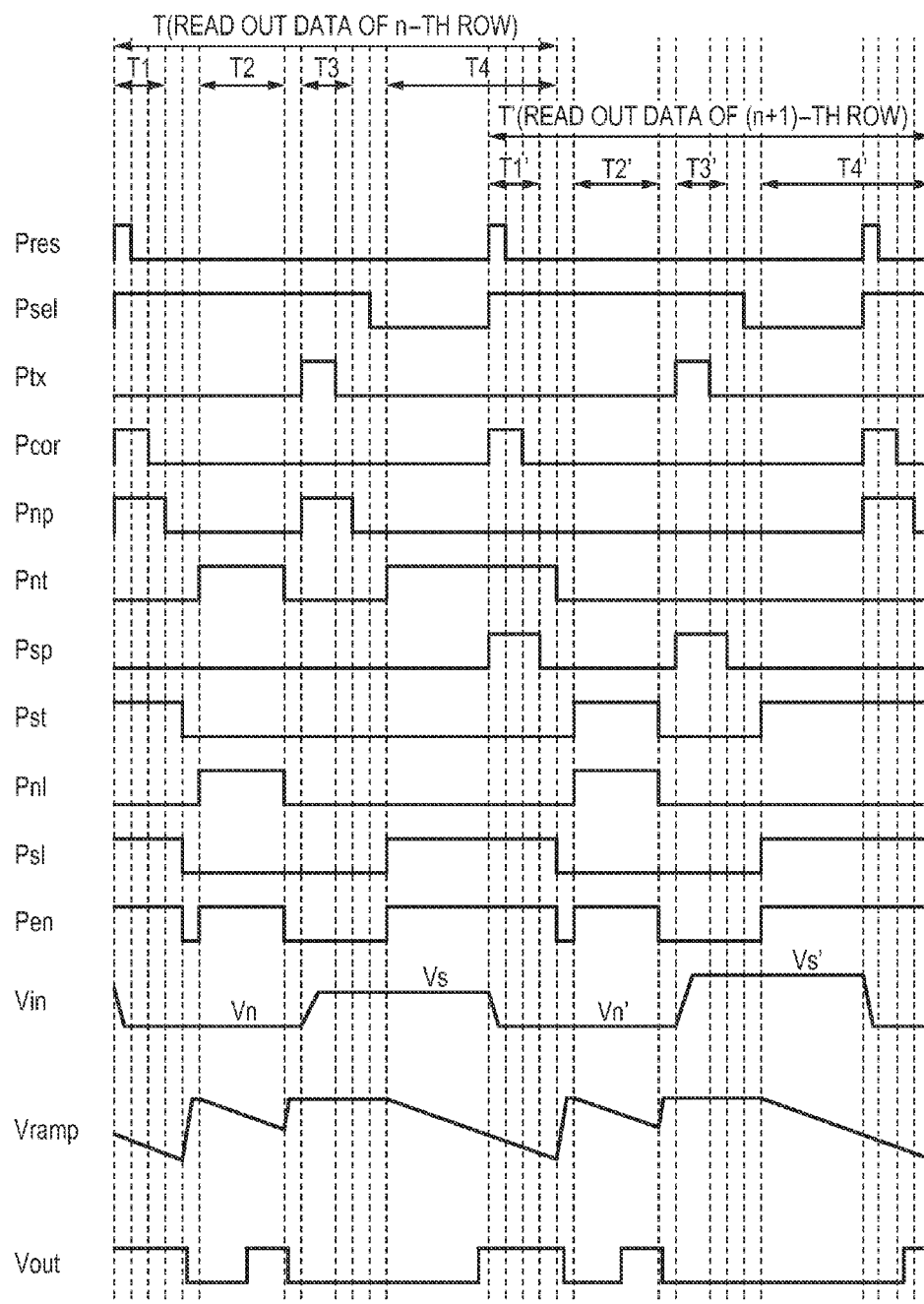
FIG. 7 is a timing chart for illustrating still another example of the operation of the solid-state imaging apparatus 100 according to the embodiment of the present invention.

An example of the operation of the solid-state imaging apparatus 100 having the A/D converters 600 will be described below with reference to the timing chart shown in FIG. 7. Respective pulse signals shown in FIG. 7 are generated by the timing controller 195, and are supplied to respective circuit elements in the solid-state imaging apparatus 100. Since waveforms of the respective pulse signals shown in FIG. 7 are the same as those of the pulse signals shown in FIG. 4, a repetitive description thereof will be avoided. In FIG. 7, the waveform of the ramp signal Vramp to be supplied during an A/D conversion period is different from FIG. 4. Periods T1 and T2 will be described below as representatives.

During the period T1, a noise signal Vn is input to the input terminal IN of the A/D converter 600 as in the timing chart shown in FIG. 4. At the beginning of the period T1, the pulse signal Pnp goes H, thus turning on the switches Snp1 and Snp2. As a result, the input terminal IN and reference voltage line 161 are connected via the capacitor Cn, and a difference between the reference voltage Vref and noise signal Vn is held in the capacitor Cn. More specifically, a potential of the first electrode of the capacitor Cn becomes equal to the noise signal Vn, and a potential of the second electrode of the capacitor Cn becomes equal to the reference voltage Vref. After the end of the period T1, the pulse signal Pnp goes L, thus turning off the switches Snp1 and Snp2.

During the period T2, the noise signal Vn is A/D-converted. At the beginning of the period T2, the pulse signal Pen goes H. The ramp signal generator 170 begins to change the ramp signal Vramp to be supplied onto the ramp signal line 171, and the counter 180 begins to count and supplies the count value Cnt onto the count data line 181. In this embodiment, when the pulse signal Pen goes H, the ramp signal generator 170 supplies the ramp signal Vramp, which begins from Vref and linearly decreases along with an elapse of time, onto the ramp signal line 171. At the beginning of the period T2, the pulse signal Pnt goes H, thus turning on the switches Snt1 and Snt2. As a result, the ramp signal line 171 and the non-inverting input terminal of the comparator CMP are connected via the capacitor Cn.

When the ramp signal Vramp begins to decrease, the potential of the first electrode of the capacitor Cn also decreases, and the potential of the second electrode of the capacitor Cn and the voltage of the non-inverting input terminal of the comparator CMP also decrease accordingly. More specifically, at a supply start timing of the ramp signal Vramp, the potential of the first electrode of the capacitor Cn becomes equal to Vref, and the potential of the second electrode of the capacitor Cn becomes equal to (2*Vref−Vn). That is, the voltage of the non-inverting input terminal of the comparator CMP becomes equal to (2*Vref−Vn). Then, when the voltage of the non-inverting input terminal of the comparator CMP falls below the voltage Vref of the inverting input terminal, the output signal from the comparator CMP is inverted from H to L, and the output signal from the inverter INV is inverted from L to H. As a result, the H-level signal is supplied to the G terminal of the latch circuit Ln1, and the count value Cnt supplied to the D terminal at that time is stored in the latch circuit Ln1 and is output from the Q terminal. The output signal from the comparator CMP is inverted when the voltage of the non-inverting input terminal of the comparator CMP becomes equal to Vref. For this reason, the latch circuit Ln1 stores a count value corresponding to a time required for the voltage of the non-inverting input terminal of the comparator CMP to change from (2*Vref−Vn) to Vref, that is, a count value corresponding to (Vref−Vn). Therefore, the count value stored in the latch circuit Ln1 is digital data corresponding to the noise signal Vn as the analog signal.

The solid-state imaging apparatus 100 having the A/D converters 600 has the same effects as those of the solid-state imaging apparatus 100 having the A/D converters 300. The modification described in association with the A/D converter 300 can be similarly applied to the A/D converter 600, and the pulse signals shown in the timing chart of FIG. 5 may be supplied in the solid-state imaging apparatus 100 having the A/D converters 600.

Figure 8:
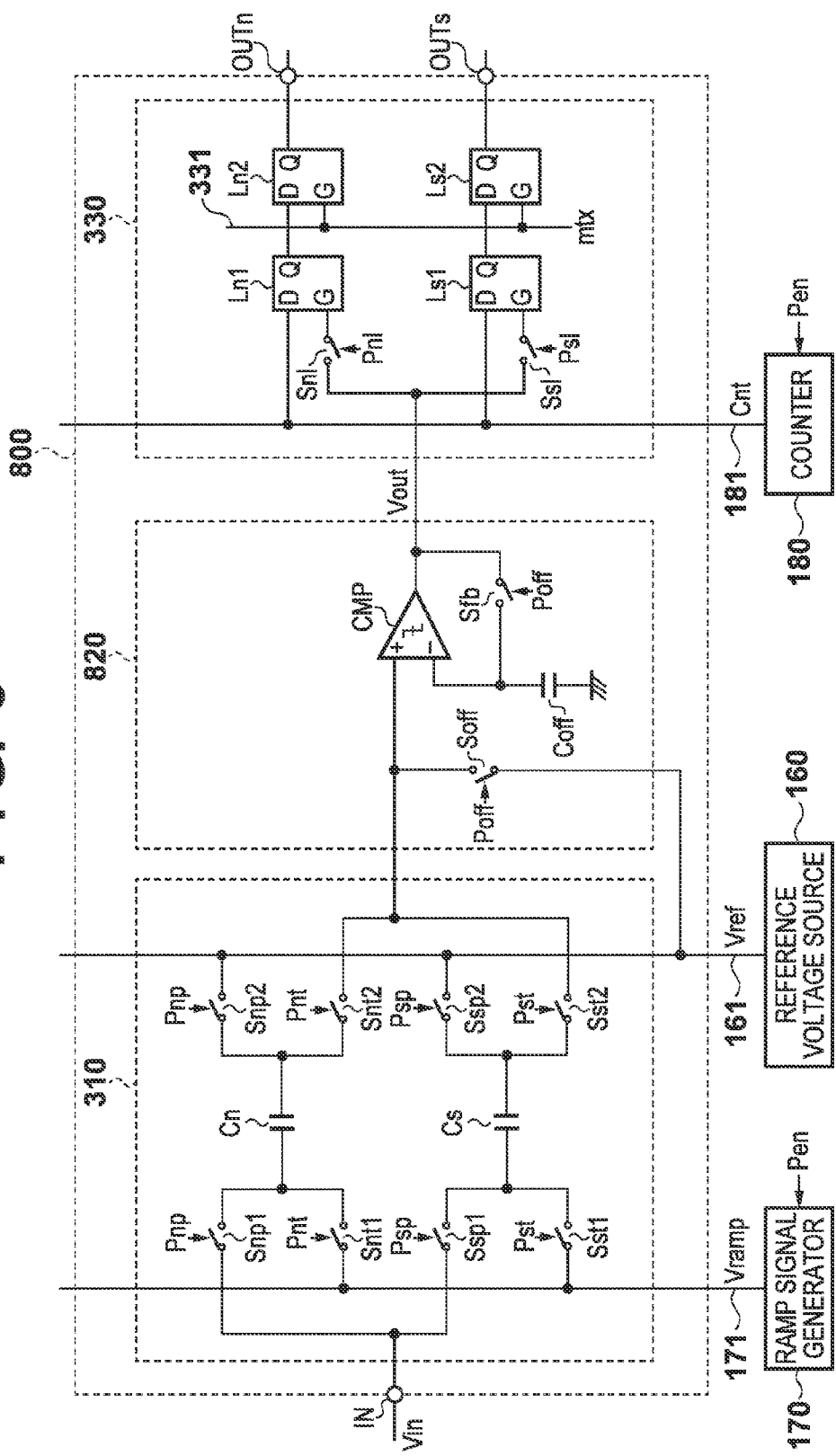
FIG. 8 is a circuit diagram for illustrating an example of the arrangement of an A/D converter 800 according to the embodiment of the present invention.

A schematic arrangement of an A/D converter 800 as still another example of the A/D converter 130 shown in FIG. 1 will be described below with reference to the equivalent circuit diagram shown in FIG. 8. The same reference numerals in FIG. 8 denote elements common to the A/D converter 300 shown in FIG. 3, and a repetitive description thereof will be avoided. The A/D converter 800 can include an input terminal IN, output terminals OUTn and OUTs, holding circuit 310, comparison circuit 820, and output circuit 330. The comparison circuit 820 compares an input voltage, which is supplied to itself based on the analog signal held in the holding circuit 310, with a threshold voltage to be compared, and outputs an output signal Vout of a level according to that comparison result.

The comparison circuit 820 can include a differential input comparator CMP, offset capacitor Coff, and various switches. A non-inverting input terminal of the comparator CMP is connected to an output line of the holding circuit 310, and an inverting input terminal of the comparator CMP is connected to the offset capacitor Coff (third capacitor). An output terminal of the comparator CMP is connected to the output circuit 330. The non-inverting input terminal of the comparator CMP is connected to the reference voltage line 161 via a switch Soff (first switch). The output terminal and inverting input terminal of the comparator CMP are connected to each other via a switch Sfb (second switch). The aforementioned embodiments have been explained under the assumption that an offset voltage of the comparator CMP is negligible. However, the comparison circuit 820 considers a comparison error generated due to an offset voltage of the comparator CMP. The comparison circuit 820 adjusts the offset voltage using the offset capacitor Coff.

An example of the operation of the solid-state imaging apparatus 100 having the A/D converters 800 will be described below with reference to the timing chart shown in FIG. 9. Respective pulse signals shown in FIG. 9 are generated by the timing controller 195, and are supplied to respective circuit elements in the solid-state imaging apparatus 100. Since waveforms of the respective pulse signals shown in FIG. 9 are the same as those of the pulse signals shown in FIG. 4, a repetitive description thereof will be avoided. FIG. 9 includes a period Toff in which offset processing is executed after the period T1 and before the period T2 unlike in FIG. 4. Since the periods other than the period Toff are the same as those in the aforementioned operation, the period Toff will be described below.

During the period Toff, a pulse signal Poff goes H, thus turning off the switches Soff and Sfb. In this manner, the inverting input terminal and output terminal of the comparator CMP are short-circuited, and the comparator CMP operates as a voltage-follower. Since the reference voltage Vref is supplied to the non-inverting input terminal of the comparator CMP, the output terminal of the comparator CMP outputs (Vref+Voff) obtained by adding the offset voltage Voff to Vref. The offset capacitor then holds (Vref+Voff). After that, the voltage of the inverting input terminal of the comparator CMP are maintained at (Vref+Voff) throughout the periods T2 and T4. The comparator compares (Vref+Voff) and a signal which is supplied from the holding circuit 310 to its non-inverting input terminal. Thus, the influence of the offset voltage can be reduced. By setting the period Toff before the periods T2 and T4, the noise signal Vn and pixel signal Vs of the same pixel can be adjusted by the same offset voltage.

The solid-state imaging apparatus 100 having the A/D converters 800 has the same effects as those of the solid-state imaging apparatus 100 having the A/D converters 300. The modification described in association with the A/D converter 300 can be similarly applied to the A/D converter 800. For example, the pulse signals shown in the timing chart of FIG. 5 may be supplied in the solid-state imaging apparatus 100 having the A/D converters 800, and the holding circuit 310 of the A/D converter 800 may be replaced by the holding circuit 610.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-202336, filed Sep. 15, 2011, which is hereby incorporated by reference herein in its entirety.

What is claimed is:

1. An A/D converter for respectively converting a first analog signal and a second analog signal into digital data, comprising:
    an input terminal configured to input the first analog signal and the second analog signal in turn;
    a first capacitor and a second capacitor;
    a reference voltage line configured to connect to a reference voltage source;
    a reference signal line configured to connect to a signal source that generates a reference signal which changes temporally;
    a comparator which has a first input terminal and a second input terminal, and outputs an output signal according to a comparison result between an input voltage supplied to said first input terminal and a threshold voltage supplied to said second input terminal; and
    an output circuit which outputs digital data corresponding to a time from when the input voltage supplied to said first input terminal of said comparator begins to change until the output signal of said comparator changes,
    wherein the first analog signal, which is input to said input terminal in a state in which said input terminal and said reference voltage line are connected via said first capacitor, is converted into digital data when the reference signal is supplied to said reference signal line in a state in which said reference signal line and said first input terminal of said comparator are connected via said first capacitor, and wherein the second analog signal, which is input to said input terminal in a state in which said input terminal and said reference voltage line are connected via said second capacitor, is converted into digital data when the reference signal is supplied to said reference signal line in a state in which said reference signal line and said first input terminal of said comparator are connected via said second capacitor.

2. The converter according to claim 1, wherein said input terminal and said reference voltage line are connected via said second capacitor in the state in which said reference signal line and said first input terminal of said comparator are connected via said first capacitor.

3. The converter according to claim 1, wherein the threshold voltage is a voltage obtained by adding an offset voltage of said comparator to a reference voltage supplied from the reference voltage source.

4. The converter according to claim 1, further comprising:
a first switch configured to connect said first input terminal of said comparator and said reference voltage line;
a second switch configured to connect said second input terminal of said comparator and said output terminal of said comparator; and
a third capacitor connected to said second input terminal of said comparator.

5. The converter according to claim 1, wherein the threshold voltage is equal to a reference voltage supplied from the reference voltage source.

6. The converter according to claim 1, wherein the reference signal is a ramp signal.

7. The converter according to claim 1, wherein said first input terminal of said comparator is a non-inverting input terminal, and said second input terminal of said comparator is an inverting input terminal.

8. A solid-state imaging apparatus comprising:
said A/D converter of claim 1;
an analog signal generator which has a plurality of pixels, and generates analog signals for said respective pixels; and
a controller which supplies the analog signals to said A/D converter and controls said A/D converter to output digital data corresponding to the analog signals.

9. The apparatus according to claim 8, wherein the analog signals generated by said analog signal generator include a pixel signal depending on a charge obtained by photoelectric conversion and a noise signal at a pixel reset timing, and
said controller supplies the pixel signal of a first pixel of said plurality of pixels to said A/D converter as the first analog signal to control said A/D converter to output digital data, and supplies the noise signal of a second pixel of said plurality of pixels to said A/D converter as the second analog signal to control said A/D converter to output digital data.

10. The apparatus according to claim 8, wherein said analog signal generator further comprises an amplifier circuit which amplifies a signal from said pixel, and said amplifier circuit generates the noise signal based on a reset-level signal of a pixel supplied from said plurality of pixels, and generates the pixel signal based on a signal obtained by superimposing a signal according to a charge generated by photoelectric conversion on the reset-level signal.

11. An A/D converter comprising:
an input terminal;
a first capacitor and a second capacitor;
a reference voltage line;
a ramp signal line;
a differential input comparator having a non-inverting input terminal and an inverting input terminal;
a latch circuit to which a count value is supplied, and which outputs the supplied count value when an output signal of said comparator changes;
a switch group which switches a state in which said first capacitor is connected between said input terminal and said reference voltage line and a state in which said first capacitor is connected between said ramp signal line and said non-inverting input terminal of said comparator; and
a switch group which switches a state in which said second capacitor is connected between said input terminal and said reference voltage line and a state in which said second capacitor is connected between said ramp signal line and said non-inverting input terminal of said comparator.

12. The converter according to claim 11, wherein said input terminal and said reference voltage line are connected via said second capacitor in the state in which said ramp signal line and said non-inverting input terminal of said comparator are connected via said first capacitor.

13. A method of controlling an A/D converter, the converter comprising
an input terminal configured to input a first analog signal and a second analog signal in turn,
a first capacitor and a second capacitor,
a reference voltage line configured to connect to a reference voltage source,
a reference signal line configured to connect to a signal source for generating a reference signal which changes temporally,
a comparator which has a first input terminal and a second input terminal, and outputs an output signal according to a comparison result between an input voltage supplied to the first input terminal and a threshold voltage supplied to the second input terminal,
an output circuit which outputs digital data corresponding to a time from when the input voltage supplied to the first input terminal of the comparator begins to change until the output signal of the comparator changes, and
a switch group which switches connection destinations of the first capacitor and the second capacitor, said method comprising:
inputting the first analog signal to the input terminal in a state in which the input terminal and the reference voltage line are connected via the first capacitor, and then supplying the reference signal to the reference signal line in a state in which the reference signal line and the first input terminal of the comparator are connected via the first capacitor; and
inputting the second analog signal to the input terminal in a state in which the input terminal and the reference voltage line are connected via the second capacitor, and then supplying the reference signal to the reference signal line in a state in which the reference signal line and the first input terminal of the comparator are connected via the second capacitor.

14. The method according to claim 13, wherein the input terminal and the reference voltage line are connected via the second capacitor in the state in which the reference signal line and the first input terminal of the comparator are connected via the first capacitor.

* * * * *